United States Patent
Masubuchi et al.

(10) Patent No.: US 12,319,210 B2
(45) Date of Patent: Jun. 3, 2025

(54) ELECTRONIC CONTROL DEVICE

(71) Applicant: Hitachi Astemo, Ltd., Hitachinaka (JP)

(72) Inventors: Takumi Masubuchi, Hitachinaka (JP); Masahiro Doi, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 497 days.

(21) Appl. No.: 17/631,786

(22) PCT Filed: Aug. 14, 2020

(86) PCT No.: PCT/JP2020/030849
§ 371 (c)(1),
(2) Date: Jan. 31, 2022

(87) PCT Pub. No.: WO2021/054007
PCT Pub. Date: Mar. 25, 2021

(65) Prior Publication Data
US 2022/0274549 A1  Sep. 1, 2022

(30) Foreign Application Priority Data
Sep. 18, 2019  (JP) .................................. 2019-169115

(51) Int. Cl.
*B60R 16/023* (2006.01)
*B60R 16/03* (2006.01)
(Continued)

(52) U.S. Cl.
CPC .......... *B60R 16/0232* (2013.01); *B60R 16/03* (2013.01); *G01R 31/3277* (2013.01); *H01H 47/002* (2013.01)

(58) Field of Classification Search
CPC . B60R 16/0232; B60R 16/03; G01R 31/3277; H01H 47/002; H02J 1/00;
(Continued)

(56) References Cited

U.S. PATENT DOCUMENTS

| 10,024,919 B2 * | 7/2018 | Nishi ................. G01R 19/0084 |
| 2006/0287805 A1 | 12/2006 | Enomoto et al. |
| 2018/0259564 A1 * | 9/2018 | Mochizuki .............. B60L 53/14 |

FOREIGN PATENT DOCUMENTS

| JP | 2006-347441 A | 12/2006 |
| JP | 2009196588 A * | 9/2009 |

(Continued)

OTHER PUBLICATIONS

International Search Report (PCT/ISA/210) issued in PCT Application No. PCT/JP2020/030849 dated Oct. 13, 2020 with English translation (four (4) pages).

(Continued)

*Primary Examiner* — Daniel R Miller
(74) *Attorney, Agent, or Firm* — Crowell & Moring LLP

(57) ABSTRACT

Even when a power supply relay cannot be turned off and when power supply to a microcomputer is normally cut off, fixing of the power supply relay is detected. An electronic control device 100 according to an aspect of the present invention includes a relay drive circuit 13 that controls on and off of a power supply relay 12 according to information about the on and off of power supply, an electronic circuit (first power supply system block 110, microcomputer 102) that operates at a first power supply voltage (V1) supplied from a battery 10 through the power supply relay 12, and a monitoring unit (second power supply system block 120) that monitors the first power supply voltage when the power supply is turned off, and holds a monitoring result, the first power supply voltage reflecting presence or absence of fixing of the power supply relay.

9 Claims, 13 Drawing Sheets

(51) Int. Cl.
*G01R 31/327* (2006.01)
*H01H 47/00* (2006.01)

(58) Field of Classification Search
CPC ..... H02M 1/08; H02H 1/0007; H02H 1/0061; H02H 11/00
See application file for complete search history.

(56) References Cited

FOREIGN PATENT DOCUMENTS

| | | |
|---|---|---|
| JP | 2009-234436 A | 10/2009 |
| JP | 2014-48070 A | 3/2014 |
| JP | 2015-217911 A | 12/2015 |

OTHER PUBLICATIONS

Japanese-language Written Opinion (PCT/ISA/237) issued in PCT Application No. PCT/JP2020/030849 dated Oct. 13, 2020 (four (4) pages).

* cited by examiner

ELECTRONIC CONTROL DEVICE

TECHNICAL FIELD

The present invention relates to an electronic control device having a function of detecting abnormality of a power supply relay that turns on and off supply of a power supply voltage.

BACKGROUND ART

Conventionally, as the electronic control device that controls a vehicle, for example, there is a device that outputs a signal controlling a conduction state of the power supply relay, which controls power supply from a battery to the electronic control device, from the electronic control device itself (power supply relay drive circuit). In this case, when a user of the vehicle turns on an ignition switch, the power supply relay drive circuit mounted in the electronic control device is turned on, and the power supply relay is brought into the conduction state. When the user turns off the ignition switch, the power supply relay drive circuit is turned off, and the power supply relay is brought into a non-conduction state to stop the power supply to the electronic control device.

In the power supply relay, when what is called on-fixing abnormality in which the power supply relay cannot be turned off while being turned on is generated, the power supply relay continues to be turned on even after the user turns off the ignition switch. Then, the power supply voltage is continuously supplied from the battery of the vehicle to the electronic control device, and a dark current seems to increase from the user, which causes battery exhaustion.

For this reason, an abnormality detection function for detecting the on-fixing abnormality of the power supply relay is required to be provided in the electronic control device, and the user is urged to perform some treatment when the on-fixing abnormality is generated. For example, PTL 1 describes the electronic control device that measures the number of activated times of a microcomputer in an off state of the ignition switch, and determines the presence or absence of the on-fixing abnormality of the power supply relay based on a measurement value.

CITATION LIST

Patent Literature

PTL 1: JP 2015-217911 A

SUMMARY OF INVENTION

Technical Problem

Meanwhile, in the electronic control device described in PTL 1, it is assumed that the power supply to the microcomputer is also continued when the power supply relay cannot be turned off. Accordingly, even when the power supply relay is not turned off when the ignition switch is turned off but the power supply to the microcomputer is normally cut off, there is a need for the means capable of detecting the fixing of the power supply relay and notifying the user.

In view of the above circumstances, an object of the present invention is to detect the fixing of the power supply relay even when the power supply relay cannot be turned off and when the power supply to the microcomputer is cut off.

Solution to Problem

In order to solve the above problem, an electronic control device according to an aspect of the present invention includes: a relay drive circuit that controls on and off of a power supply relay according to information about on and off of a power supply; an electronic circuit that operates at a first power supply voltage supplied from a battery through the power supply relay; and a monitoring unit that monitors the first power supply voltage when the power supply is turned off, and holds a monitoring result, the first power supply voltage reflecting presence or absence of fixing of the power supply relay.

Advantageous Effects of Invention

According to at least one aspect of the present invention, even when the power supply relay cannot be turned off and when the power supply to the monitoring unit is normally cut off, the fixing of the power supply relay can be detected based on the monitoring result of the first power supply voltage reflecting the presence or absence of the fixing of the power supply relay.

Objects, configurations, and advantageous effects other than those described above will be clarified by the description of the following embodiments.

DESCRIPTION OF EMBODIMENTS

Figure 1:
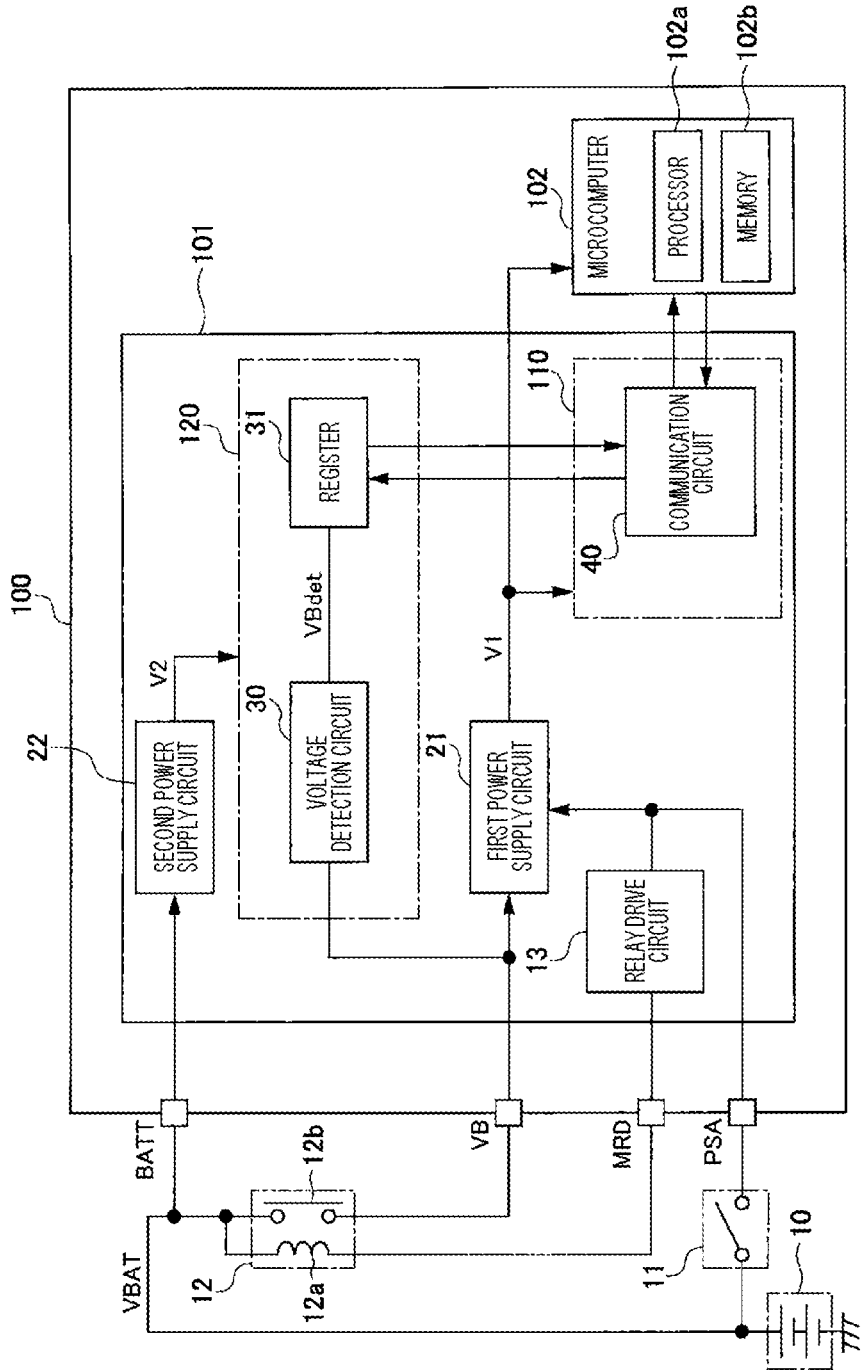
FIG. 1 is a block diagram illustrating an example of a configuration of an electronic control device according to a first embodiment of the present invention.

Hereinafter, examples of a mode for carrying out the present invention (hereinafter, described as an "embodiment") will be described with reference to the accompanying drawings. In the specification and the accompanying drawings, components having substantially the same function or configuration are denoted by the same reference numerals, and overlapping description is omitted.

1. First Embodiment

First, a configuration of an electronic control device according to a first embodiment of the present invention will be described.

FIG. 1 is a block diagram illustrating an example of the configuration of an electronic control device 100 of the first embodiment. The electronic control device 100 in FIG. 1 is configured to be able to detect that a contact 12b of a power source relay 12 is fixed. The power supply relay 12 may be either a mechanical type or a semiconductor type. In the specification, fixing the contact 12b of the power source relay 12 is described as "fixing the power source relay 12". In the following description, turning on (closing) and off (opening) of the contact 12b of the power supply relay 12 is referred to as "turning on and off the power supply relay 12".

The electronic control device 100 includes a terminal BATT to which a power supply voltage VBAT (second power supply voltage) generated by a battery 10 is directly supplied, a terminal VB to which the power supply voltage VBAT (first power supply voltage) is supplied through the contact 12b of the power supply relay 12, a terminal MRD connected to the other end (coil 12a) of the power supply relay 12, and a terminal PSA to which the power supply voltage VBAT is supplied when an ignition switch 11 is turned on. For example, the electronic control device 100 is an electronic control unit (ECU). Power to a relay drive circuit 13 is turned on and off by turning on and off the ignition switch 11.

In the specification, for simplification of the description, names of wirings connected to the terminals of the electronic control device 100 are the same as the names of the terminals. For example, the wiring connected to the terminal VB is referred to as a wiring VB.

The electronic control device 100 includes a power supply IC 101 and a microcomputer 102. The power supply IC 101 includes a relay drive circuit 13 that controls on or off the power supply relay 12, a first power supply circuit that generates an internal voltage V1 (first internal voltage) to be supplied to the inside of the electronic control device 100, and a second power supply circuit 22 that generates an internal voltage V2 (second internal voltage) to be supplied to the inside of the electronic control device 100. In addition, the power supply IC 101 includes a first power supply system block 110 that is a circuit block that operates by being supplied with power by the internal voltage V1, and a second power supply system block 120 that is a circuit block that operates by being supplied with power by the internal voltage V2.

In the first embodiment, for example, the second power supply system block 120 includes a voltage detection circuit 30 that detects the voltage at the wiring connected to the terminal VB and a register 31 that holds a detection result of the voltage detection circuit 30. The voltage detection circuit 30 and the register 31 are an example of the monitoring unit. For example, the first power supply system block 110 includes a communication circuit 40 that writes and reads data to and from the register 31 in accordance with an instruction from the microcomputer 102.

The relay drive circuit 13 receives the wiring connected to the terminal PSA as an input and receives the wiring connected to the terminal MRD as an output. When the power supply voltage VBAT is supplied through the terminal PSA, the relay drive circuit 13 causes the potential of the wiring connected to the terminal MRD to be equal to the ground level to control the power supply relay 12 to an on state. In addition, when the power supply voltage VBAT is not supplied through the terminal PSA, the relay drive circuit 13 has a function of controlling the power supply relay 12 to an off state while keeping the potential of the wiring connected to the terminal MRD at the power supply voltage VBAT.

Figure 2:
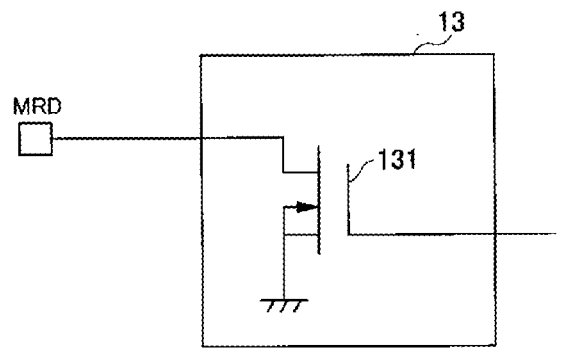
FIG. 2 is a view illustrating an example of a configuration of a relay drive circuit included in the electronic control device of the first embodiment of the present invention.

FIG. 2 illustrates an example of a configuration of the relay drive circuit 13.

The relay drive circuit 13 can be configured using a switching element 131 such as a metal oxide semiconductor field effect transistor (MOSFET). FIG. 2 illustrates an example in which an N-channel MOSFET is used as the switching element 131. A gate of the switching element 131 is connected to the terminal PSA, a drain of the switching element 131 is connected to the terminal MRD, and a source of the switching element 131 is grounded. When the power supply voltage VBAT is supplied to the gate through the terminal PSA, a drain-source path is brought into a conductive (on) state, the current flows through the coil 12a to turn on the contact 12b. On the other hand, when the power supply voltage VBAT is not supplied to the gate, the drain and the source are brought into a non-conductive (off) state, a current does not flow through the coil 12a to turn off the contact 12b. The example of FIG. 2 is used to describe the basic function of the relay drive circuit 13, but is not limited to this configuration.

The power supply voltage VBAT supplied from the terminal VB is the input of the first power supply circuit 21, and the first power supply circuit 21 is controlled depending on whether the power supply voltage VBAT is applied through the terminal PSA. The first power supply circuit 21 has a function for outputting the internal voltage V1 to the second power supply system block 120 and the microcomputer 102 when the power supply voltage VBAT is applied through the terminal PSA while the power supply voltage VBAT is supplied through the terminal VB. In addition, the first power supply circuit 21 has a function for not outputting the internal voltage V1 when the power supply voltage VBAT is not supplied through the terminal VB or when the power supply voltage VBAT is not applied through the terminal PSA.

The second power supply circuit 22 has a function for receiving the power supply voltage VBAT supplied through the terminal BATT as input and outputting the internal voltage V2 to the second power supply system block 120, and does not output the internal voltage V2 when the power supply voltage VBAT is not input. As described above, the second power supply circuit 22 operates with the power supply voltage VBAT directly supplied from the battery 10 through the path (terminal BATT) not through the power supply relay 12. Thus, the power supply voltage VBAT is supplied to the second power supply circuit 22 regardless of on and off of the power supply relay 12.

The voltage detection circuit 30 has a function for outputting a detection result of the power supply voltage VBAT supplied from the terminal VB as VBdet. A voltage level of VBdet is a binary value of a high level (hereinafter, "H level") or a low level (hereinafter, "L level").

Figure 3:
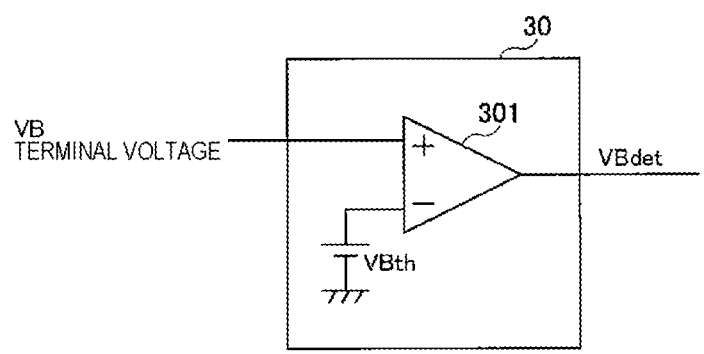
FIG. 3 is a view illustrating an example of a configuration of a voltage detection circuit included in the electronic control device of the first embodiment of the present invention.

FIG. 3 illustrates an example of a configuration of the voltage detection circuit 30.

For example, the voltage detection circuit 30 is constructed from a comparator 301 and a constant voltage circuit that generates a threshold voltage VBth. The wiring VB is connected to a non-inverting input terminal (+ terminal) of the comparator 301, and the threshold voltage VBth is input to an inverting input terminal (− terminal) of the comparator 301. The comparator 301 outputs a H-level voltage detection result VBdet when the power supply voltage VBAT (first power supply voltage) input from the terminal VB is larger than the threshold voltage VBth.

The communication circuit 40 is connected to the microcomputer 102 and the register 31, and has a function for writing binary information of the H level or the L level to the register 31 according to an instruction from the microcomputer 102 or reading binary information held by the register 31 and transmitting the binary information to the microcomputer 102.

The register 31 (an example of the storage) is connected to the voltage detection circuit 30 and the communication circuit 40, and holds the binary information written from the microcomputer 102 through the communication circuit 40 when the output VBdet of the voltage detection circuit 30 is at the H level. When the output VBdet of the voltage detection circuit 30 is at the L level, the register 31 always holds only the information at the L level.

Figure 4:
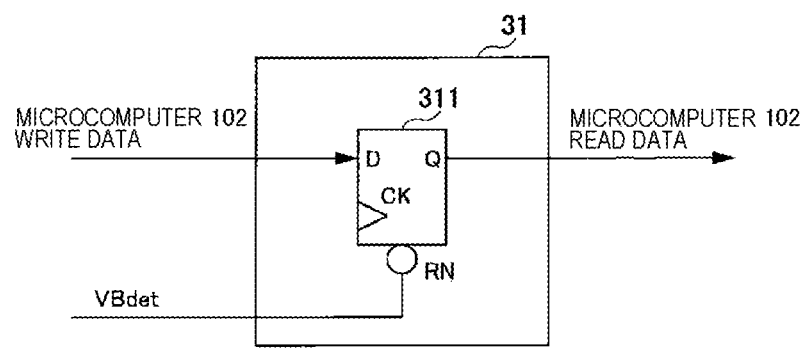
FIG. 4 is a view illustrating an example of a configuration of a register included in the electronic control device of the first embodiment of the present invention.

FIG. 4 illustrates an example of a configuration of the register 31.

For example, the register 31 includes a D-type flip-flop 311. The data written from the microcomputer 102 is input to an input terminal D of the D-type flip-flop 311 through the communication circuit 40, and the held data is output from an output terminal Q. The output VBdet of the comparator 301 is input to a reset terminal RN of the D-type flip-flop 311. The reset terminal RN is an inverting input. For example, a clock signal generated by the second power supply system block 120 is input to a clock terminal.

While the L-level signal is input to the reset terminal RN, the D-type flip-flop 311 is in a reset state, and the held value is always at the L level. While the H-level signal is input to the reset terminal RN, the D-type flip-flop 311 is in a non-reset state, and holds the H-level or L-level data written from the microcomputer 102 through the communication circuit 40 in the first embodiment.

As described above, the register 31 (an example of the storage) is configured to hold and output the information written by the processor (processor 102a), reset the held information by the signal obtained by inverting the low-level signal output from the voltage detection circuit (voltage detection circuit 30), and output the low-level signal.

The microcomputer 102 operates when the internal voltage V1 is supplied from the first power supply circuit 21, and has a function for writing the binary information to the register 31 through the communication circuit 40 or reading the binary information from the register 31. The microcomputer 102 includes a processor 102a such as a CPU and a memory 102b such as a RAM and a ROM. The processor 102a is a main body of an operation of the microcomputer 102. A noise removal circuit or the like is often provided between the microcomputer 102 and the wiring to which the internal voltage V1 is supplied.

When the power supply voltage is continuously supplied from the battery 10 to the terminal VB even after the ignition switch 11 is turned off (the power supply IC 101 is shut down) due to the fixing of the power supply relay 12, the value of the register 31 that stores the detection result of the voltage detection circuit 30 is held. Accordingly, after the ignition switch 11 is turned on again, the microcomputer 102 can read the register value and detect the fixing of the power supply relay 12.

[Operation when Power Source Relay is not Fixed]

The operation of the electronic control device 100 configured as described above will be described below. First, with reference to FIG. 5, it is assumed that the power supply relay 12 can be normally controlled to be turned on or off.

Figure 5:
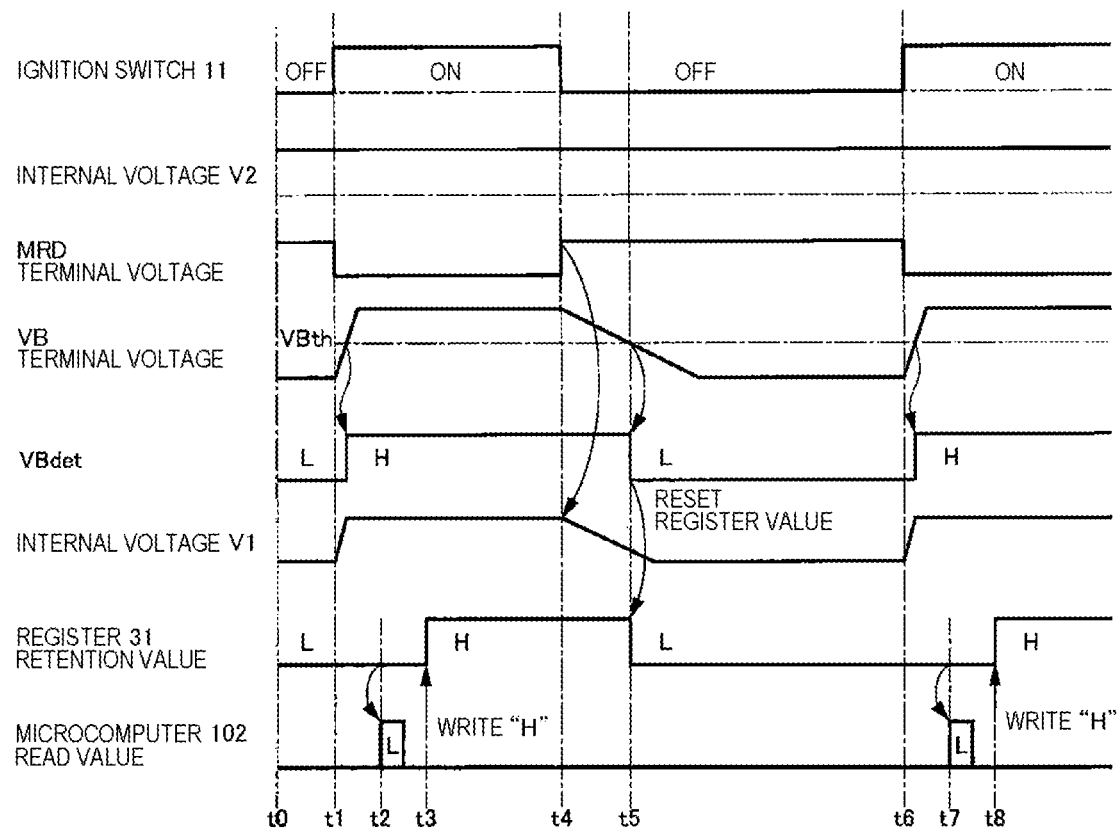
FIG. 5 is a timing chart illustrating an example of an operation when a power supply relay is not fixed on in the electronic control device of the first embodiment of the present invention.

FIG. 5 is a timing chart illustrating an example of the operation when the power supply relay 12 is not fixed on in the electronic control device 100. The on-fixing means that the contact 12b of the power supply relay 12 is fixed in the on state and does not change to the off state. The off-fixing is the opposite state. The on-fixing is generated due to a failure such as contact welding of the power supply relay 12, a ground short-circuit on the output side (between the drain and the source of the switching element 131) of the relay drive circuit 13, and the like. FIG. 5 illustrates an example of operation timings of the ignition switch 11, the internal voltage V2, the voltage at the MRD terminal, the voltage at the terminal VB, VBdet, the internal voltage V1, the held value (held data) of the register 31, and the read value (read data) of the microcomputer 102. A horizontal axis of this timing chart represents a time lapse.

It is assumed that the ignition switch 11 is in the off state at an initial time t0 of the timing chart in FIG. 5. At this point, the potential of the terminal MRD connected to the relay drive circuit 13 is substantially equal to the power supply voltage VBAT, and the power supply relay 12 is controlled to the off state. That is, the power supply voltage VBAT is not supplied to the terminal VB. At this point, the internal voltage V1 is not output from the first power supply circuit 21, and the communication circuit 40 and the microcomputer 102 are in a non-operating state.

On the other hand, the power supply voltage VBAT is supplied to the terminal BATT, and the second power supply circuit 22 outputs the internal voltage V2 and supplies the internal voltage V2 to the second power supply system block 120. At this point, the voltage detection circuit 30 and the register 31 that are included in the second power supply system block 120 are in an electrically operable state.

However, because the power supply voltage VBAT is not supplied to the voltage detection circuit 30 through the terminal VB, the output VBdet of the voltage detection circuit 30 outputs the L level, the register 31 enters the reset state to hold the L level.

The case where the ignition switch 11 is switched from off to on at a time t1 in FIG. 5 is considered. At this point, the power supply voltage VBAT is supplied to the terminal PSA through the ignition switch 11, the switching element 131 of the relay drive circuit 13 is turned on to draw the current from the terminal MRD, and the power supply relay 12 is turned on. When the power supply relay 12 is turned on, the power supply voltage VBAT is supplied to the terminal VB, and the first power supply circuit 21 outputs the internal voltage V1. The communication circuit 40 and the microcomputer 102 start the operation upon receiving the supply of the internal voltage V1.

The power supply voltage VBAT is similarly supplied to the voltage detection circuit 30, and the output VBdet changes from the L level to the H level when the power supply voltage VBAT exceeds the threshold voltage VBth. When the output VBdet of the voltage detection circuit 30 becomes the H level, the register 31 changes from the reset state to the non-reset state.

Subsequently, at a time t2, the microcomputer 102 reads the data held in the register 31 (D-type flip-flop 311) through the communication circuit 40. The data held in the register 31 at the time t2 is at the L level, and the read data is also at the L level. The microcomputer 102 performs predetermined processing such as initialization during a period from the time t1 to the time t2, and promptly reads the data after completion of the predetermined processing.

Subsequently, at a time t3, the microcomputer 102 writes the H-level data in the register 31 (D-type flip-flop 311) through the communication circuit 40, and the H-level data is held in the register 31.

When the ignition switch 11 is switched from on to off at time t4, the relay drive circuit 13 is turned off. For this reason, the voltage (first power supply voltage) at the terminal VB gradually decreases due to the current consumption in the electronic control device 100.

When the voltage at the terminal VB falls below the threshold voltage VBth at time t5, the output VBdet of the voltage detection circuit 30 changes to the L level. Consequently, the register 31 enters the reset state, and the data held in the register 31 changes to the L level.

Then, the same operation as the case where the ignition switch 11 is turned on at the time t1 is performed after the ignition switch 11 is turned on again at time t6. At a time t7, similarly to the time t2, the microcomputer 102 reads the L-level data from the register 31 through the communication circuit 40. Then, at a time t8, the microcomputer 102 writes the H-level data into the register as at the time t3 in preparation for the next fixing detection.

[Operation when Power Source Relay is Fixed On]

The case where the power supply relay 12 cannot be normally controlled to the on or off state will be described below.

Figure 6:
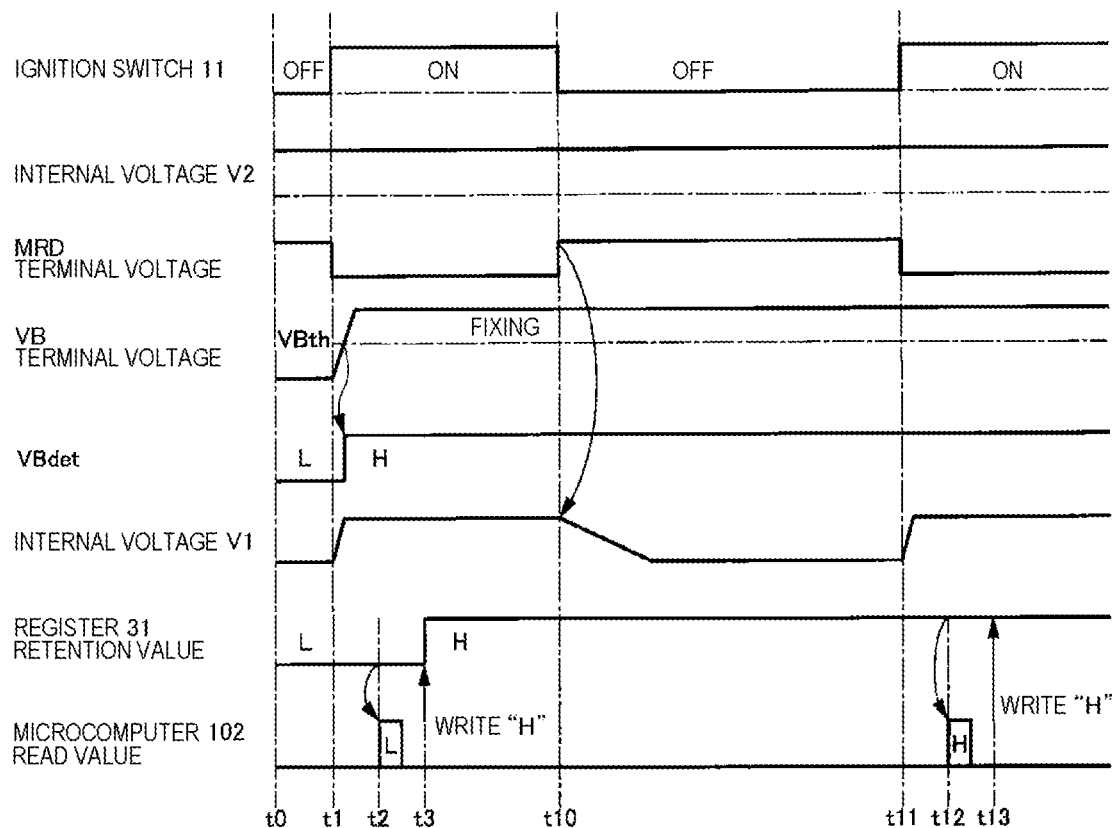
FIG. 6 is a timing chart illustrating an example of an operation when the power supply relay is fixed on in the electronic control device of the first embodiment of the present invention.

FIG. 6 is a timing chart illustrating an example of the operation when the power supply relay 12 is fixed on in the electronic control device 100. In the timing chart of FIG. 6, the on or off of the power supply relay 12 can be controlled until the time t3 similarly to FIG. 5, but the description will be given assuming that the power supply relay 12 is fixed in the on state until a time t10 after the time t3. Because the operation from the initial time t0 to the time t3 is the same as the example in FIG. 5, the description thereof will be omitted.

When the ignition switch 11 is switched from on to off at the time t10 while the power supply relay 12 is fixed in the on state between the time t3 and the time t10, the power supply relay 12 is fixed in the on state, so that the power supply voltage VBAT is continuously supplied to the terminal VB of the electronic control device 100. At this point, although the power supply voltage VBAT is continuously supplied to the first power supply circuit 21, the voltage application through the terminal PSA is not performed by turning off the ignition switch 11, so that the first power supply circuit 21 stops the output of the internal voltage V1. Accordingly, the communication circuit 40 and the microcomputer 102 stop the operation because the supply of the internal voltage V1 is stopped.

On the other hand, because the second power supply circuit 22 receives the supply of the power supply voltage VBAT through the terminal BATT and outputs the internal voltage V2 regardless of whether the power supply relay 12 is fixed, the voltage detection circuit 30 continues the operation, and the output VBdet remains at the H level. Accordingly, the register 31 holds the H-level data written from the microcomputer 102 at the time t3.

Then, when the ignition switch 11 is turned on again at a time t11, the power supply voltage VBAT is applied to the first power supply circuit 21 through the terminal PSA. Then, the first power supply circuit 21 outputs the internal voltage V1 based on the power supply voltage VBA, and the communication circuit 40 and the microcomputer 102 start the operation.

At a time t12, the microcomputer 102 reads the data held in the register 31 through the communication circuit 40. At this point, because the register 31 holds the H-level data, the microcomputer 102 reads the H-level data. That is, assuming the case where the power supply relay 12 is fixed in the on state, the H-level data different from the L-level data read at the time t2 is read. As described above, the microcomputer 102 reads the H-level data from the register 31, the microcomputer 102 can detect that the power supply relay 12 is fixed in the on state.

Then, at a time t13, the microcomputer 102 writes the H-level data in the register 31 similarly to the time t8.

As described above, the configuration and method for implementing the electronic control device 100 capable of detecting that the power supply relay 12 is fixed in the on state become clear according to the first embodiment.

(Study on the Case where Power Source Relay is Fixed Off)

The operation of the electronic control device 100 in the case where the power supply relay 12 is fixed in the off state for some reason and does not transition to the on state will be described with reference to FIG. 1.

When the power supply relay 12 is in the off state even though the ignition switch 11 is switched from off to on to supply the power supply voltage VBAT to the relay drive circuit 13 through the terminal PSA, the power supply voltage VBAT supplied from the battery 10 is not supplied to the terminal VB of the electronic control device 100. Accordingly, the first power supply circuit 21 operated by the power supply voltage VBAT supplied through the terminal VB becomes also the state in which the supply of the power supply voltage VBAT is not received, and the first power supply circuit 21 does not output the internal voltage V1. That is, the communication circuit 40 and the microcomputer 102 that operate by the supply of the internal voltage V1 also do not operate. Consequently, the operation of the electronic control device 100 described in the first embodiment can be implemented only when the power supply relay 12 is in the on-fixing state.

As described above, the electronic control device (electronic control device 100) of the first embodiment includes the relay drive circuit (relay drive circuit 13) that controls the on or off of the power supply relay (power supply relay 12) according to the information about the on or off of the power supply (ignition switch 11), the electronic circuit (first power supply system block 110, microcomputer 102) that operates at the first power supply voltage (the power supply voltage VBAT through the terminal VB) supplied from the battery (battery 10) through the power supply relay, and the monitoring unit (second power supply system block 120) that monitors the first power supply voltage in turning off of the power supply and holds the monitoring result, the first power supply voltage reflecting the presence or absence of fixing of the power supply relay.

According to the electronic control device having the above configuration, the monitoring unit detects and holds the state in which the power supply to the electronic control device cannot be cut off due to the on-fixing state of the power supply relay. Then, the monitoring result (read data) including the information about the fixing of the power source relay from the monitoring unit is read after the power source is turned on, and the user of the vehicle is notified of the monitoring result, so that the user can be prompted to take necessary measures. As described above, even when the power supply relay cannot be turned off and when the power supply to the monitoring unit is normally cut off, the electronic control device of the first embodiment can detect the fixing of the power supply relay based on the monitoring result of the first power supply voltage reflecting the presence or absence of the fixing of the power supply relay.

Furthermore, in the electronic control device (electronic control device 100) of the first embodiment, the monitoring unit (second power supply system block 120) includes the voltage detection circuit (voltage detection circuit 30) that outputs the signal of the level (H, L) corresponding to the voltage value of the first power supply voltage (the power supply voltage VBAT through the terminal VB), and the storage (register 31) that holds the information indicating the presence or absence of the decrease in the first power supply voltage based on the signal output from the voltage detection circuit when the power supply (ignition switch 11) is turned off, as the monitoring result.

According to the electronic control device having the above configuration, the information indicating the presence or absence of the decrease in the first power supply voltage based on the signal output from the voltage detection circuit is held in the storage, whereby the information can be output in response to the read request of the information from the outside.

In addition, in the electronic control device (electronic control device 100) of the first embodiment, the electronic circuit (first power supply system block 110, microcomputer 102) includes the processor (processor 102*a*) that reads the information indicating the presence or absence of the decrease in the first power supply voltage (the power supply voltage VBAT through the terminal VB) held in the storage (register 31) and writes the information in the storage. The processor is configured to detect the fixing abnormality of the power supply relay (power supply relay 12) based on the information read from the storage.

According to the electronic control device having the above configuration, the processor can read the information indicating the presence or absence of the decrease in the first power supply voltage held in the storage at an arbitrary timing and detect the fixing abnormality of the power supply relay.

Furthermore, in the electronic control device (electronic control device 100) of the first embodiment, the voltage detection circuit (voltage detection circuit 30) is configured to compare the first power supply voltage (the power supply voltage VBAT through the terminal VB) with the threshold voltage (VBth), output the high-level signal to the storage (register 31) when the first power supply voltage is larger than the threshold voltage, and output the low-level signal otherwise.

According to the electronic control device having the above configuration, the voltage detection circuit outputs the high-level signal to the storage when the first power supply voltage is larger than the threshold voltage, and outputs the low-level signal otherwise, whereby the information indicating the high level or the information indicating the low level is stored in the storage.

Furthermore, in the electronic control device (electronic control device 100) of the first embodiment, the processor (processor 102*a*) is configured to perform the reading from the storage (register 31) when the power supply (ignition switch 11) is switched from off to on, and detect the fixing abnormality of the power supply relay (power supply relay 12) based on the first read information read from the storage last time (time t2) and the second read information read from the storage this time (times t7, t12).

According to the electronic control device having the above configuration, when the power is switched from off to on, the first read information read from the storage last time is compared with the second read information read from the storage this time (after turned on again), and the fixing abnormality of the power supply relay can be detected from the comparison result.

Furthermore, in the electronic control device (electronic control device 100) of the first embodiment, the processor (processor 102*a*) is configured to determine that the power supply relay (power supply relay 12) has the fixing abnormality when the first read information read from the storage last time (time t2) is the information indicating the low level and when the second read information read from the storage this time (times t7, t12) is the information indicating the high level.

According to the electronic control device having the above configuration, when the first read information read from the storage last time is the information indicating the low level and when the second read information read from the storage this time (after turned on again) changes to the information indicating the high level, the determination that the first power supply voltage is not decreased to the voltage threshold, namely, the fixing abnormality of the power supply relay is generated can be made.

Furthermore, in the electronic control device (electronic control device 100) of the first embodiment, when the power supply (ignition switch 11) is turned on from off, the processor (processor 102*a*) is configured to read the information from the storage (register 31), and write information indicating the high level in the storage after reading the information from the storage.

According to the electronic control device having the above configuration, the information is read from the storage when the power is turned on from off, and then the information indicating the high level is written in the storage, so that the fixing abnormality of the power supply relay can be detected from the change in the information held in the storage when the power is turned on from off.

Furthermore, in the electronic control device (electronic control device 100) of the first embodiment, the monitoring unit (second power supply system block 120) is operated by the second power supply voltage (the power supply voltage VBAT through the terminal BATT) supplied from the battery (battery 10) by the path (the path through the terminal BATT) not through the power supply relay (power supply relay 12).

According to the electronic control device having the above configuration, the monitoring unit is directly supplied with the second power supply voltage from the battery without being affected by the on and off (fixing) of the power supply relay.

2. Second Embodiment

In a second embodiment, another example of the configuration and operation of the electronic control device capable of detecting that the power supply relay 12 is fixed in the on state will be described.

Figure 7:
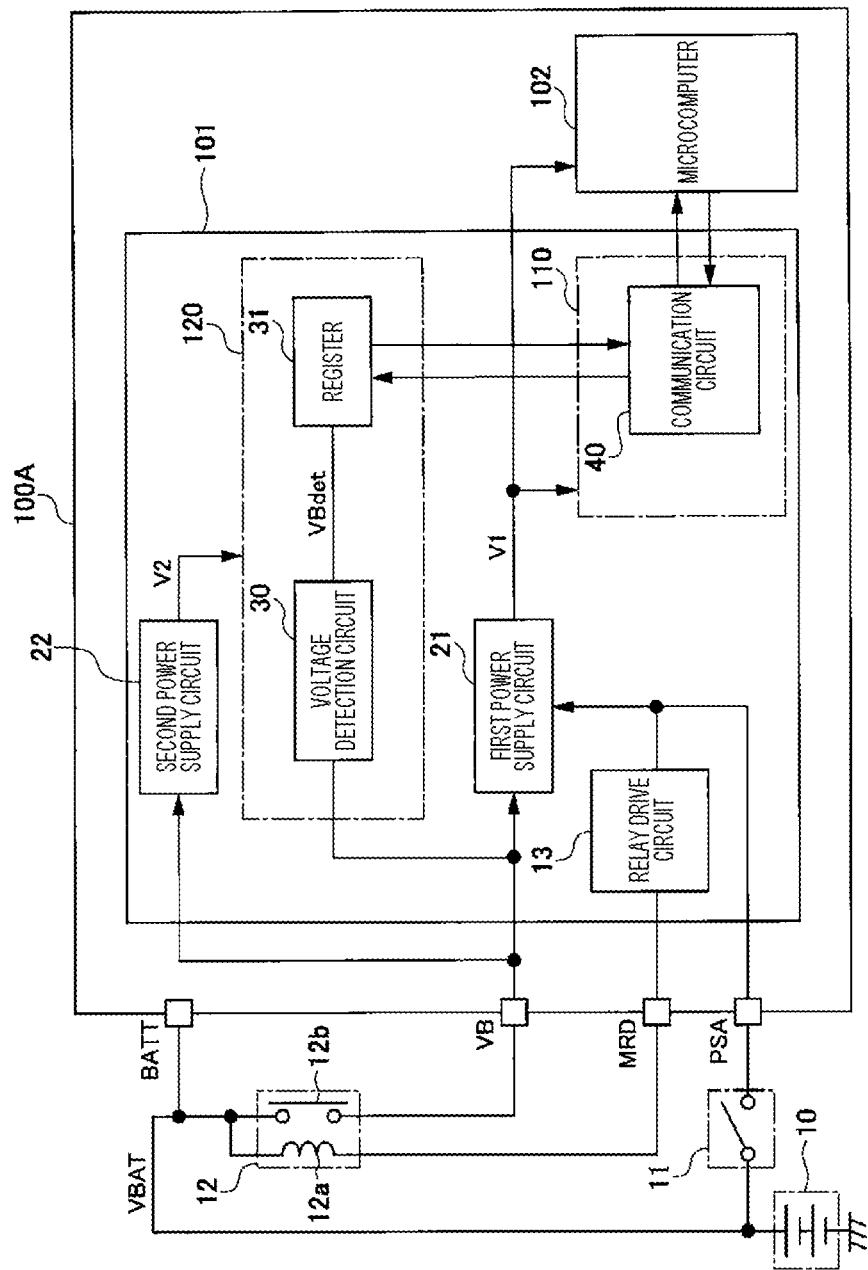
FIG. 7 is a block diagram illustrating an example of a configuration of an electronic control device according to a second embodiment of the present invention.

FIG. 7 is a block diagram illustrating an example of a configuration of an electronic control device 100A of the second embodiment. Hereinafter, a difference between the electronic control device 100A of the second embodiment and the electronic control device 100 of the first embodiment will be described.

The electronic control device 100A in FIG. 7 is different from the electronic control device 100 (FIG. 1) of the first embodiment in that the power supply voltage VBAT supplied through the terminal VB is the input of the second power supply circuit 22. As described above, the power supply voltage VBAT (first power supply voltage) is supplied to the terminal VB through the contact 12b of the power supply relay 12. For this reason, similarly to the first power supply circuit 21, the power supply voltage VBAT supplied to the second power supply circuit 22 can be turned on and off by the contact 12b of the power supply relay 12. At the same time, the power supply voltage VBAT supplied to the second power supply circuit 22 is affected by the fixing of the power supply relay 12 (contact 12b).

[Operation when Power Source Relay is not Fixed]

The operation of the electronic control device 100A will be described below. First, the case where the power supply relay 12 can be normally controlled to be turned on or off will be described with reference to FIG. 8.

Figure 8:
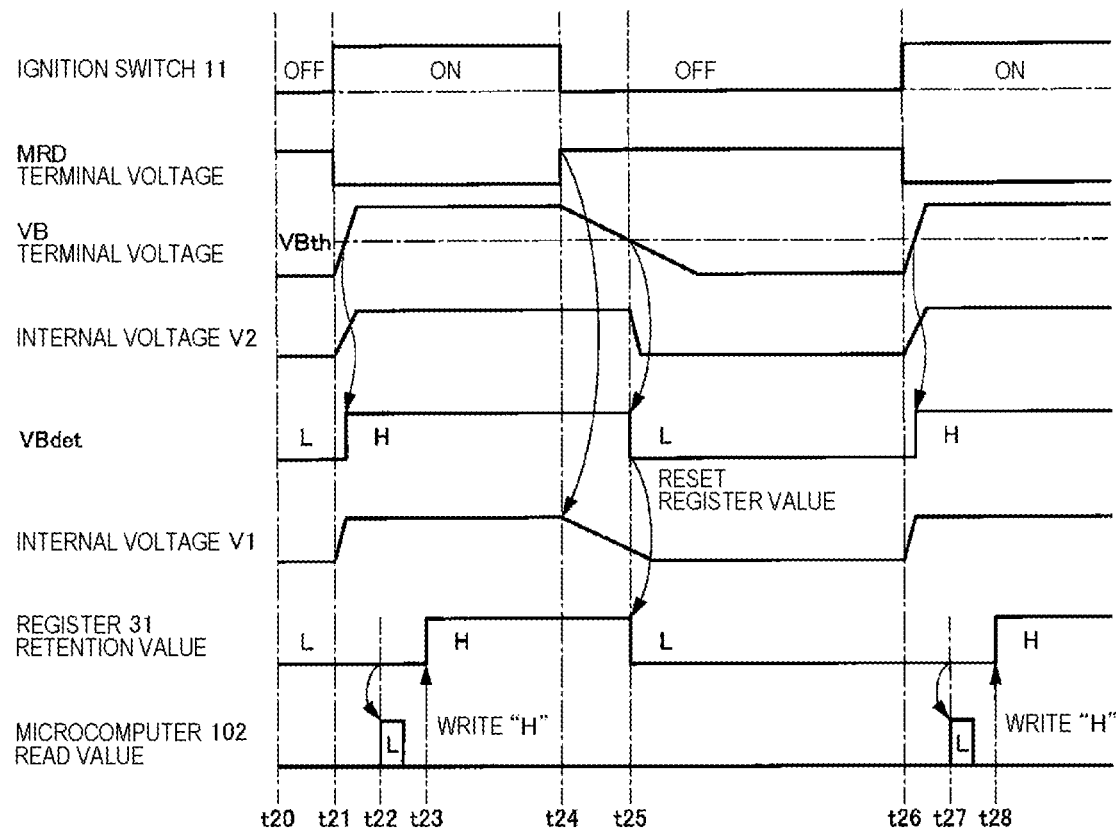
FIG. 8 is a timing chart illustrating an example of an operation when the power supply relay is not fixed on in the electronic control device of the second embodiment of the present invention.

FIG. 8 is a timing chart illustrating an example of the operation when the power supply relay 12 is not fixed on in the electronic control device 100A. In items described in the timing chart of FIG. 8, for the item described in the timing chart of FIG. 5 (first embodiment), the state at the initial time t0 in FIG. 5 is the same as the state at an initial time t20 in FIG. 8.

When the ignition switch 11 is switched from off to on at a time t21 in FIG. 8, the relay drive circuit 13 is turned on, and the relay drive circuit 13 turns on the power supply relay 12. When the power supply relay 12 is turned on, the power supply voltage VBAT is supplied to the terminal VB, the first power supply circuit 21 outputs the internal voltage V1, and the second power supply circuit 22 outputs the internal voltage V2. The voltage detection circuit 30 and the register 31 start the operation upon receiving the supply of the internal voltage V2. Furthermore, the power supply voltage VBAT is input to the voltage detection circuit 30 through the terminal VB, and the output VBdet changes from the L level to the H level when the power supply voltage VBAT exceeds the threshold voltage VBth. When the output VBdet of the voltage detection circuit 30 becomes the H level, the register 31 changes from the reset state to the non-reset state.

Subsequently, at a time t22, the microcomputer 102 reads the data held in the register 31 through the communication circuit 40. The data held in the register 31 at the time t22 is at the L level, and the read data is also at the L level.

Subsequently, at a time t23, the microcomputer 102 writes the H-level data in the register 31 through the communication circuit 40, and the H-level data is held in the register 31.

When the ignition switch 11 is switched from on to off at a time t24, the relay drive circuit 13 is turned off. For this reason, the voltage (first power supply voltage) at the terminal VB gradually decreases due to the current consumption in the electronic control device 100. As the voltage at the terminal VB decreases, the internal voltage V2 cannot maintain the voltage necessary for the operation of the voltage detection circuit 30 and the data holding of the register 31.

At a time t25, the operation of the register 31 is stopped, and the output of the register 31 is fixed (reset) to the L level. Similarly to the time t5 described above, even when the voltage at the terminal VB falls below the threshold voltage VBth, the output VBdet of the voltage detection circuit 30 may change to the L level, the register 31 may be in the reset state, and the data held in the register 31 may change to the L level.

Then, the same operation as the case where the ignition switch 11 is turned on at the time t21 is performed after the ignition switch 11 is turned on again at a time t26. At a time t27, the microcomputer 102 reads the L-level data from the register 31 through the communication circuit 40 similarly to the time t22. Then, at a time t28, the microcomputer 102 writes the H-level data in the register 31 similarly to the time t23.

[Operation when Power Source Relay is Fixed]

The case where the power supply relay 12 cannot be normally controlled to the on or off state will be described below.

Figure 9:
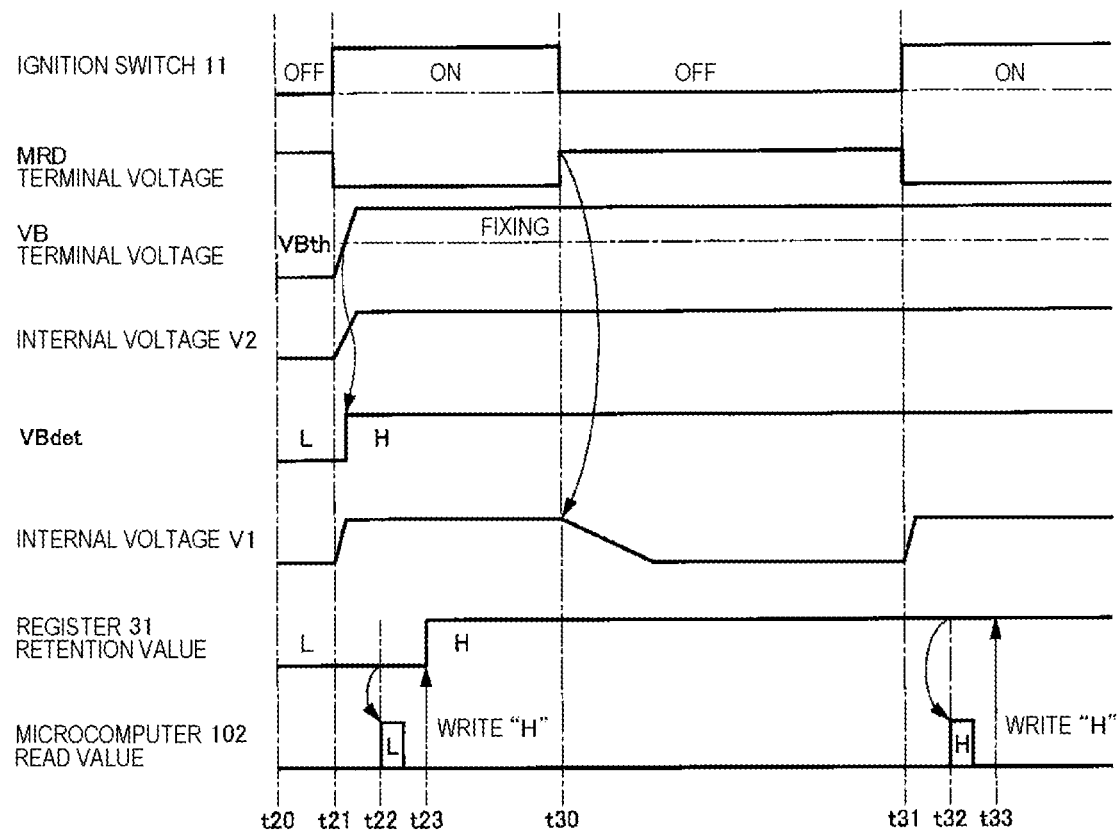
FIG. 9 is a timing chart illustrating an example of an operation when the power supply relay is fixed on in the electronic control device of the second embodiment of the present invention.

FIG. 9 is a timing chart illustrating an example of the operation when the power supply relay 12 is fixed on in the electronic control device 100A. In the timing chart of FIG. 9, the on and off of the power supply relay 12 can be controlled from the initial time t20 to the time t23 similarly to FIG. 8, but the description will be given assuming that the power supply relay 12 is fixed in the on state during the time from the time t23 to a time t30. Because the operation from the initial time t20 to the time t23 is the same as the example in FIG. 8, the description thereof will be omitted.

When the ignition switch 11 is switched from on to off at the time t30 in a state where the power supply relay 12 is fixed in the on state between the time t23 and the time t30, the power supply relay 12 is fixed in the on state, so that the power supply voltage VBAT is continuously supplied to the terminal VB of the electronic control device 100. At this point, although the power supply voltage VBAT is continuously supplied to the first power supply circuit 21, the voltage application through the terminal PSA is not performed by turning off the ignition switch 11, so that the first power supply circuit 21 stops the output of the internal voltage V1. Accordingly, the communication circuit 40 and the microcomputer 102 stop the operation because the supply of the internal voltage V1 is stopped.

On the other hand, because the second power supply circuit 22 continues to output the internal voltage V2 by receiving the supply of the power supply voltage VBAT through the fixed power supply relay 12, the voltage detection circuit 30 continues the operation, and the output VBdet remains at the H level. Accordingly, the register 31 holds the H-level data written from the microcomputer 102 at the time t23.

Then when the ignition switch 11 is turned on again at a time t31, the power supply voltage VBAT is applied to the first power supply circuit 21 through the terminal PSA, the first power supply circuit 21 outputs the internal voltage V1, and the communication circuit 40 and the microcomputer 102 start the operation.

At a time t32, the microcomputer 102 reads the data held in the register 31 through the communication circuit 40. At this point, because the register 31 holds the H-level data, the microcomputer 102 reads the H-level data. That is, assuming that the power supply relay 12 is fixed in the on state, the H-level data different from the L-level data read at the time t22 is read. As described above, similarly to the first embodiment, the microcomputer 102 reads the H-level data from the register 31, whereby the microcomputer 102 can detect that the power supply relay 12 is fixed in the on state.

At a time t33, the microcomputer 102 writes the H-level data in the register 31 similarly to the time t28.

Focusing on the difference between the electronic control device 100 of the first embodiment and the electronic control device 100A of the second embodiment, the second power supply circuit 22 is different from the first power supply circuit 21 in that the second power supply circuit 22 receives the supply of the power supply voltage VBAT through the terminal BATT, or similarly to the first power supply circuit 21, the second power supply circuit 22 receives the supply of the power supply voltage VBAT from the terminal VB through the power supply relay 12. That is, in other words, it is found that the on-fixing of the power supply relay 12 can be detected even when the second power supply circuit 22 is supplied with power through the same path as the first power supply circuit 21.

As described above, in the electronic control device (electronic control device 100A) of the second embodiment, the monitoring unit (second power supply system block 120) operates by the first power supply voltage (the power supply voltage VBAT through the terminal VB).

According to the electronic control device having the above-described configuration of the second embodiment, the monitoring unit is affected by the on and off (fixing) of the power supply relay 12 when operating at the first power supply voltage (power supply voltage VBAT) supplied from the battery (battery 10) through the power supply relay (power supply relay 12). Also in the second embodiment configured as described above, similarly to the first embodiment, when the power supply relay cannot be turned off and when the power supply to the monitoring unit is normally cut off, the fixing of the power supply relay can be detected based on the monitoring result of the first power supply voltage reflecting the presence or absence of the fixing of the power supply relay.

3. Third Embodiment

In a third embodiment, an example of a configuration and an operation of an electronic control device that detects that the power supply relay 12 is fixed on while preventing erroneous detection that the power supply relay 12 is fixed when the ignition switch 11 is turned on again before the voltage at the terminal VB falls below the threshold voltage VBth because the ignition-off period is short although the power supply relay 12 is not actually fixed will be described.

Figure 10:
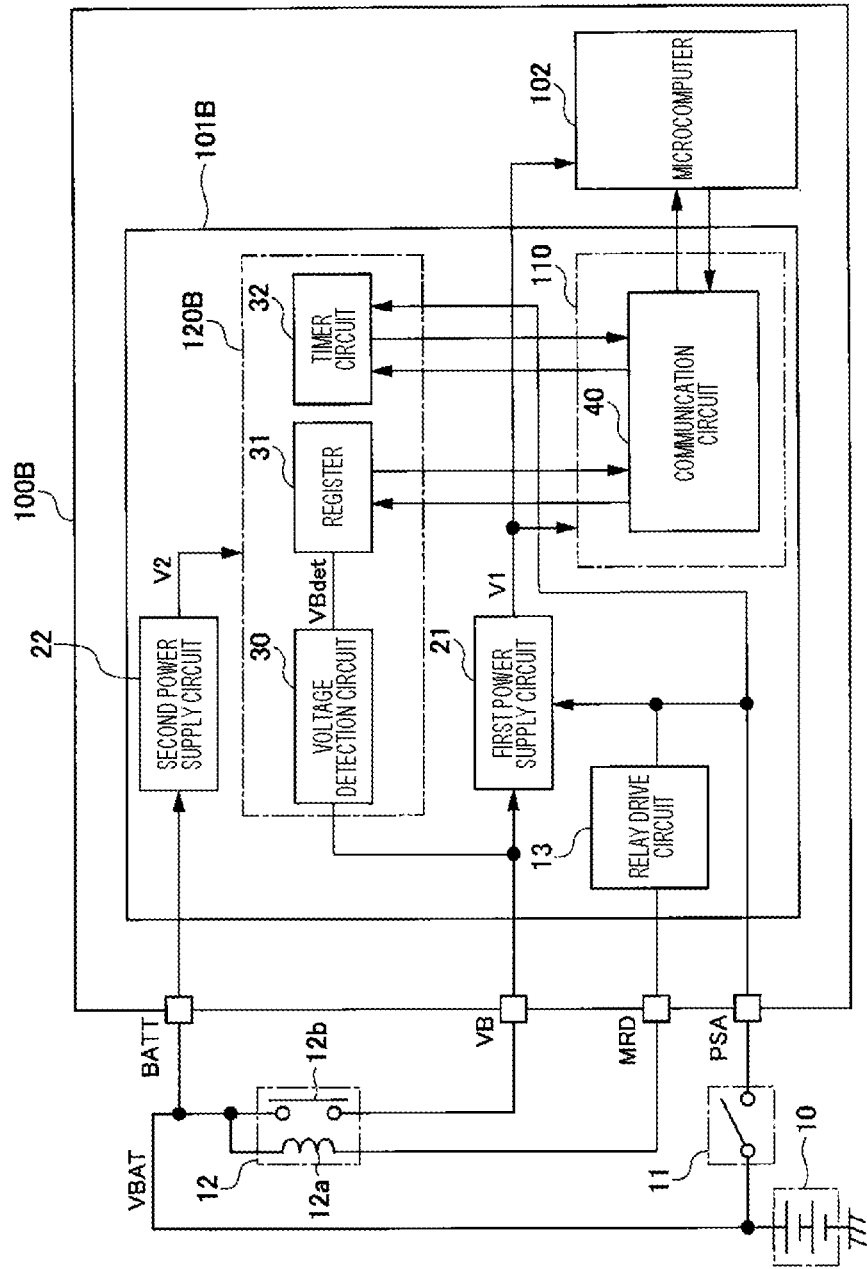
FIG. 10 is a block diagram illustrating an example of a configuration of an electronic control device according to a third embodiment of the present invention.

FIG. 10 is a block diagram illustrating an example of a configuration of an electronic control device 100B of the third embodiment. Hereinafter, a difference between the electronic control device 100B of the third embodiment and the electronic control device 100 of the first embodiment will be described.

The electronic control device 100B in FIG. 10 further includes a timer circuit 32 that measures an off-time from a time point at which the ignition switch 11 is switched from the on state to the off state in a second power supply system block 120B that operates by the supply of the internal voltage V2. That is, in the third embodiment, the timer circuit 32 is provided in the configuration of the first embodiment.

The timer circuit 32 is connected to the communication circuit 40 and the wiring PSA, and measures time in the state where the power supply voltage VBAT is not supplied to the wiring PSA. The microcomputer 102 can read time information measured by the timer circuit 32 from the timer circuit 32 through the communication circuit 40.

Figure 11:
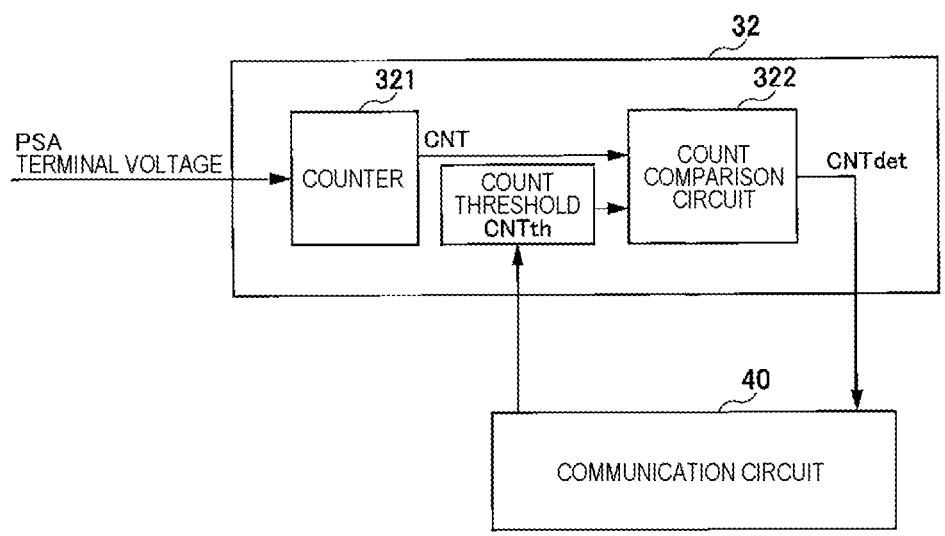
FIG. 11 is a block diagram illustrating an example of a configuration of a timer circuit included in the electronic control device of the third embodiment of the present invention.

FIG. 11 is a block diagram illustrating an example of a configuration of the timer circuit 32.

For example, as illustrated in FIG. 11, the timer circuit 32 includes a counter 321 that periodically increases and outputs a count value CNT by a clock signal (not specified), a count threshold CNTth, and a count comparison circuit 322 that compares the count value CNT with a count threshold CNTth. The count comparison circuit 322 outputs a count comparison result CNTdet to the communication circuit 40 as binary information about the H level or the L level.

The counter 321 fixes the count value CNT to zero when the potential of the PSA terminal is the power supply voltage VBAT, and periodically increases the count value CNT by the clock signal (not illustrated) when the potential of the PSA terminal is the ground potential.

Figure 12:
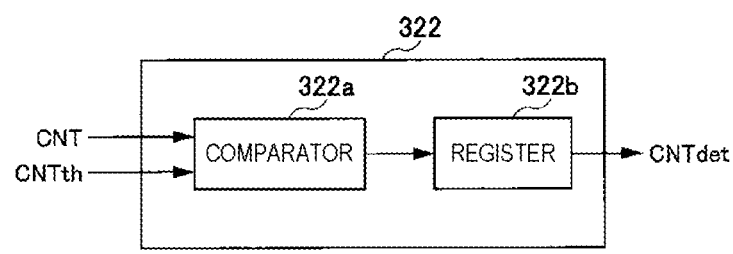
FIG. 12 is a block diagram illustrating an example of a configuration of a count comparison circuit included in the timer circuit of the third embodiment of the present invention.

FIG. 12 is a block diagram illustrating an example of a configuration of the count comparison circuit 322 included in the timer circuit 32.

The count comparison circuit 322 includes a comparator 322a that compares the count value CNT of the counter 321 with the count threshold CNTth and outputs a comparison result, and a register 322b that holds the comparison result output by the comparator 322a. The comparator 322a outputs the H-level data as the count comparison result CNTdet when the count value CNT is greater than the count threshold CNTth, and the comparator 322a outputs the L-level data as the count comparison result CNTdet in other cases. For example, the comparator 322a can be configured by a comparator.

The microcomputer 102 can read the count comparison result CNTdet from the register 322b of the timer circuit 32 through the communication circuit 40, and can write a desired value as the count threshold CNTth. As an example, the count threshold CNTth is stored in a register or a memory included in the timer circuit 32.

With reference to timing charts in FIGS. 13 to 15, a description will be given of the electronic control device 100B detecting that the power supply relay is fixed and avoiding the erroneous detection in the case of the short ignition-off period.

[Operation when Power Source Relay is not Fixed (1)]

Figure 13:
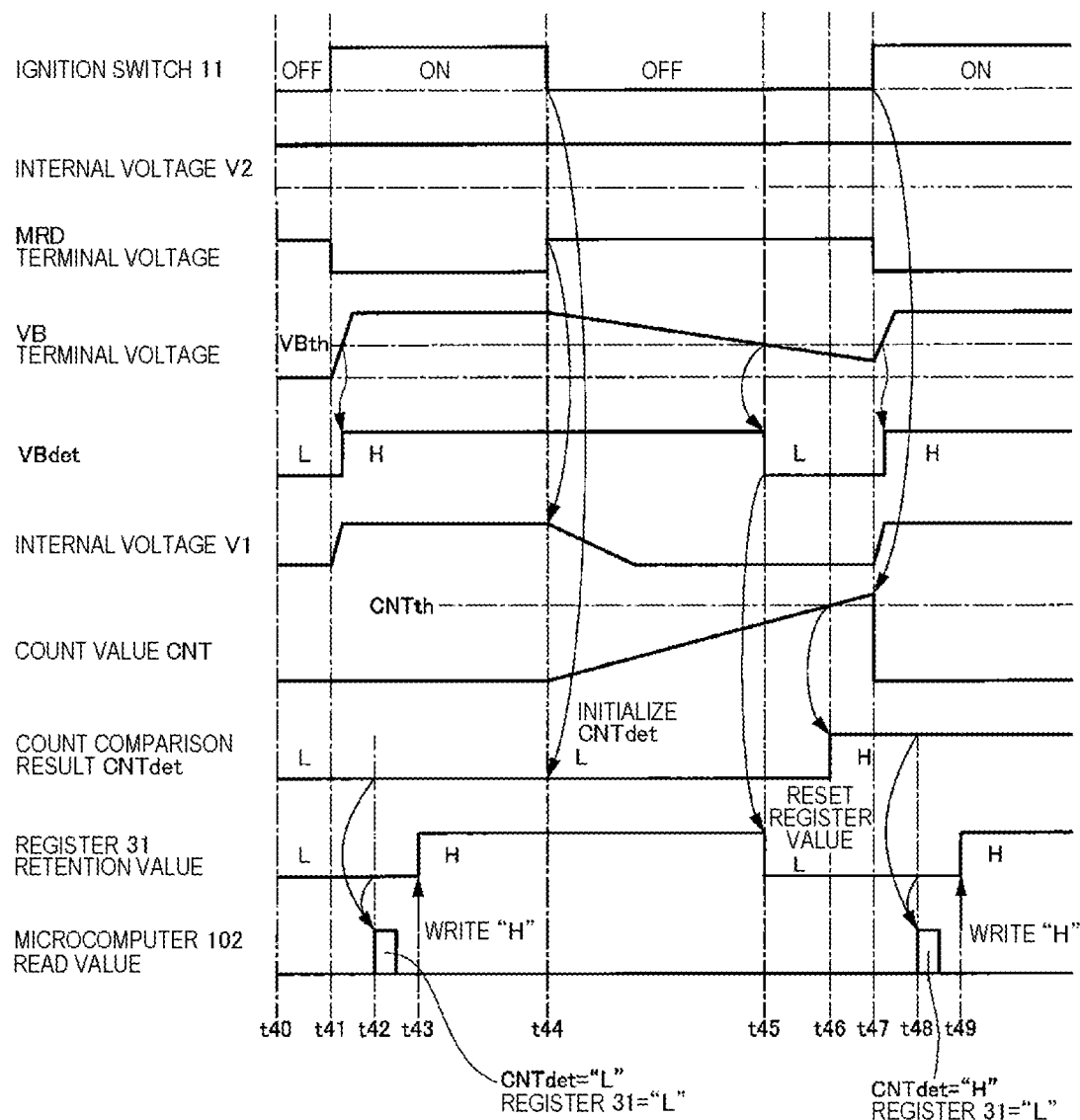
FIG. 13 is a timing chart illustrating an example of an operation when the power supply relay is not fixed on in the electronic control device of the third embodiment of the present invention.

FIG. 13 is a timing chart illustrating an example of the operation when the power supply relay 12 is not fixed on in the electronic control device 100B.

In the timing chart of FIG. 13, it is assumed that the power supply relay 12 can be controlled to be normally on and off and that the off period of the ignition switch 11 is sufficiently long. Specifically, the case where the ignition switch 11 is turned on again after the voltage at the terminal VB becomes less than the threshold voltage VBth after the turn-off of the ignition switch 11.

In the items described in the timing chart of FIG. 13, for the item described in the timing chart of FIG. 5 (first embodiment), the state at the initial time t0 in FIG. 5 is the same as the state at an initial time t40 in FIG. 13. For common items, the operation from the initial time t40 to a time t44 is basically the same. Regarding the difference between the flowchart in FIG. 13 and the flowchart in FIG. 5, for the sake of simplicity of the description, it is assumed that the count value CNT of the counter 321 is zero and that the count comparison result CNTdet is the L level in the initial state at the initial time t20.

The case where the ignition switch 11 is switched from off to on at a time t41 in FIG. 13 is considered. The operation of the electronic control device 100B at this time is the same as the operation at the time t1 described in the first embodiment (FIG. 5). That is, the power supply voltage VBAT is supplied to the terminal PSA through the ignition switch 11, and the relay drive circuit 13 turns on the power supply relay 12. When the power supply relay 12 is turned on, the power supply voltage VBAT is supplied to the terminal VB, and the first power supply circuit 21 outputs the internal voltage V1. The communication circuit 40 and the microcomputer 102 start the operation upon receiving the supply of the internal voltage V1.

The power supply voltage VBAT is similarly supplied to the voltage detection circuit 30, and the output VBdet changes from the L level to the H level when the power supply voltage VBAT exceeds the threshold voltage VBth. When the output VBdet becomes the H level, the register 31 changes from the reset state to the non-reset state.

Subsequently, at a time t42, the microcomputer 102 reads the data held in the register 31 through the communication circuit 40 and the count comparison result CNTdet held in the register 322b of the timer circuit 32. Specifically, in the third embodiment, at the initial time t40, the data held in the register 31 is set to the L level, and the count comparison result CNTdet is also set to the L level in the initial state. Accordingly, for the data read by the microcomputer 102 at the time t42, both the data held in the register 31 and the count comparison result CNTdet are at the L level.

Subsequently, at a time t43, the microcomputer 102 writes the H-level data in the register 31 through the communication circuit 40, and the H-level data is held in the register 31.

Subsequently, at a time t44, when the ignition switch 11 is switched from on to off, the relay drive circuit 13 is turned off. For this reason, the voltage (first power supply voltage) at the terminal VB gradually decreases due to the current consumption in the electronic control device 100B. However, the voltage drop rate at the terminal VB in FIG. 13 is less than the voltage drop rate at the terminal VB in FIG. 5.

At the time t44, the timer circuit 32 (counter 321) starts the measurement of the off-time of the ignition switch 11, and initializes the count comparison result CNTdet to the L level. In the third embodiment, because the initial state of the count comparison result CNTdet is described as the L level, the value of the count comparison result CNTdet does not change before and after the writing is performed at the time t43.

When the voltage at the terminal VB falls below the threshold voltage VBth at a time t45, the output VBdet of the voltage detection circuit 30 changes to the L level. Consequently, the register 31 enters the reset state, and the data held in the register 31 changes to the L level.

At a time t46, when the count value CNT of the counter 321 of the timer circuit 32 reaches the count threshold CNTth, the output of the count comparison result CNTdet of the count comparison circuit 322 changes to the H level.

Then, when the ignition switch 11 is turned on again at a time t47, the count value CNT of the timer circuit 32 is returned to zero in addition to the operation similar to the case where the ignition switch 11 is turned on at the time t41. On the other hand, the count comparison result CNTdet of the timer circuit 32 is not changed and the value is held.

At a time t48, similarly to the time t42, the microcomputer 102 reads the data held in the register 31 through the communication circuit 40 and the count comparison result CNTdet output from the timer circuit 32. The difference between the time t42 and the time t48 is that the count value CNT of the timer circuit 32 reaches the count threshold CNTth at the time t46, whereby the H level is read to the microcomputer 102 as the data of the count comparison result CNTdet.

Finally, at a time t49, the microcomputer 102 writes the H-level data in the register 31 similarly to the time t43. From the above, in the timing chart of FIG. 13, the read data from the register 31 after turning on the ignition switch 11 again is at the L level, so that the determination that the power supply relay 12 is normally turned off can be made.

[Operation when Power Source Relay is not Fixed (2)]

Figure 14:
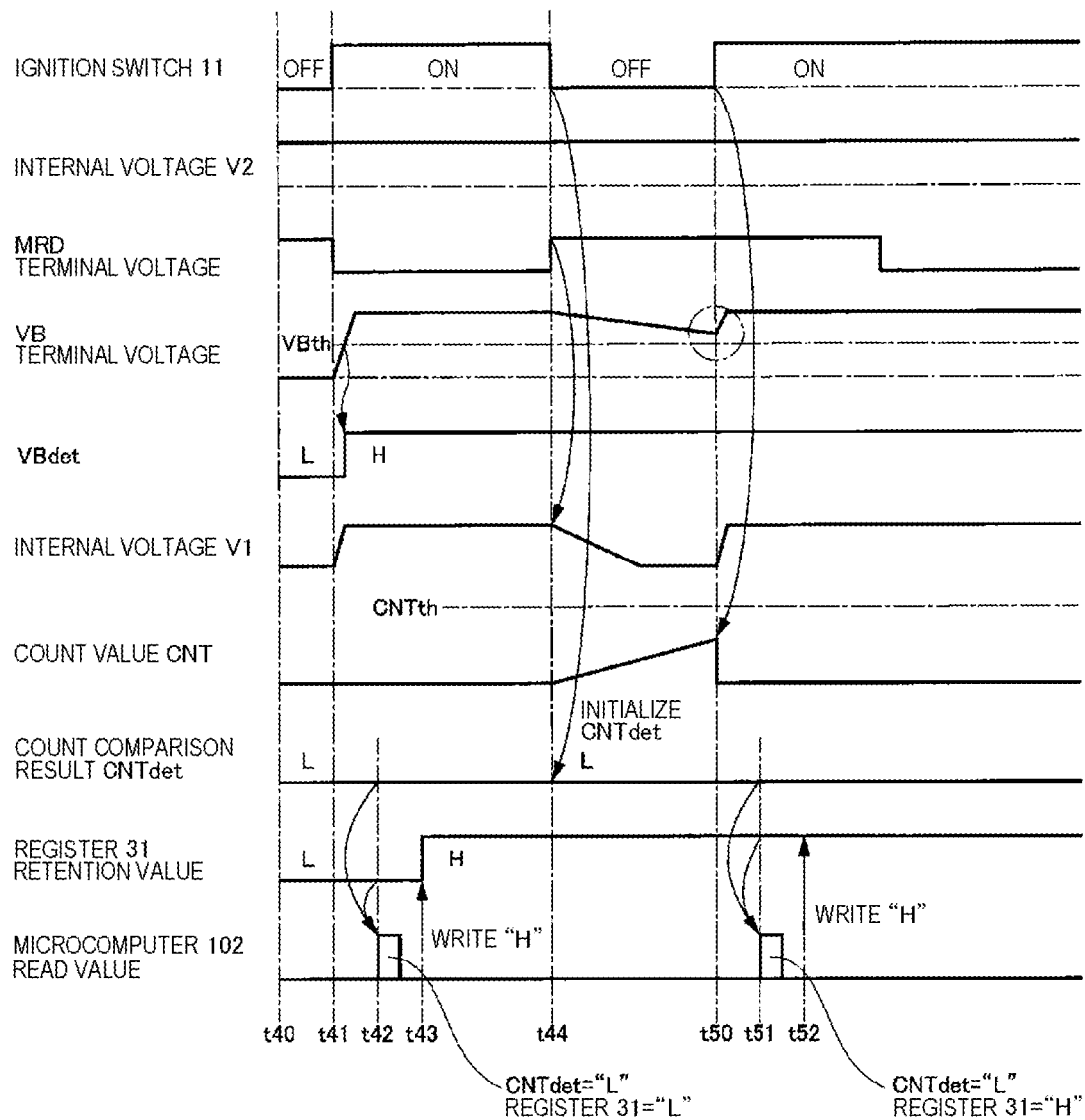
FIG. 14 is a timing chart illustrating another example different from FIG. 13 of the operation when the power supply relay is not fixed on in the electronic control device of the third embodiment of the present invention.

FIG. 14 is a timing chart illustrating an example of another example different from FIG. 13 when the power supply relay 12 is not fixed on in the electronic control device 100B.

Subsequently, in the timing chart of FIG. 14, it is assumed that the power supply relay 12 can be normally controlled to the on or off state and that the off-period of the ignition switch 11 is short. Specifically, the case where the ignition switch 11 is turned on again before the voltage at the terminal VB falls below the threshold voltage VBth after the turn-off of the ignition switch 11 will be considered. At this point, it is assumed that the count value CNT of the timer circuit 32 that counts the off-period of the ignition switch 11 is before reaching the count threshold CNTth. Because the operation from the initial time t40 to the time t44 in FIG. 14 is the same as the example in FIG. 13, the description thereof is omitted.

The case where the ignition switch 11 is turned off at time t44 and switched from off to on again at a time t50 is considered. The difference between the time t50 and the time t47 in FIG. 13 lies in that the voltage at the terminal VB does not fall below the threshold voltage VBth (a circled portion of a one-dot chain line) at the time t50, and that the output VBdet of the voltage detection circuit 30 is at the H level. As described above, the count value CNT of the timer circuit 32 at the time t50 is before reaching the count threshold CNTth, and the value of the count comparison result CNTdet is at the L level.

At a time t51, the microcomputer 102 reads the data held in the register 31 through the communication circuit 40 and the count comparison result CNTdet output from the timer circuit 32. At a time t52, the microcomputer 102 writes the H-level data in the register 31 similarly to the time t43.

A difference between the time t51 and the time t48 in FIG. 13 is that H-level data is read from the register 31 even though the power supply relay 12 is not fixed on. That is, in the first embodiment, it is determined that the power supply relay 12 is in the on-fixed state based on the fact that the data read from the register 31 is at the H level. However, the timing chart in FIG. 14 suggests that there is a possibility of erroneous diagnosis of the on-fixing of the power supply relay 12 depending on the time until the ignition switch 11 is turned on again after turned off.

In order to avoid the above erroneous diagnosis, in the third embodiment, the timer circuit 32 is disposed and the off-period of the ignition switch 11 is measured. Consequently, the erroneous diagnosis that the power supply relay 12 is in the on-fixed state can be prevented when the ignition switch 11 is turned on again before the voltage at the terminal VB falls below the threshold voltage VBth of the voltage detection circuit 30. Specifically, when the microcomputer 102 reads the L level from the count comparison result CNTdet of the timer circuit 32, the microcomputer 102 ignores the H-level data read from the register 31 and determines that the power supply relay 12 is not in the on-fixed state.

[Operation when Power Source Relay is Fixed On]

The case where the power supply relay 12 cannot be normally controlled to the on or off state will be described below.

Figure 15:
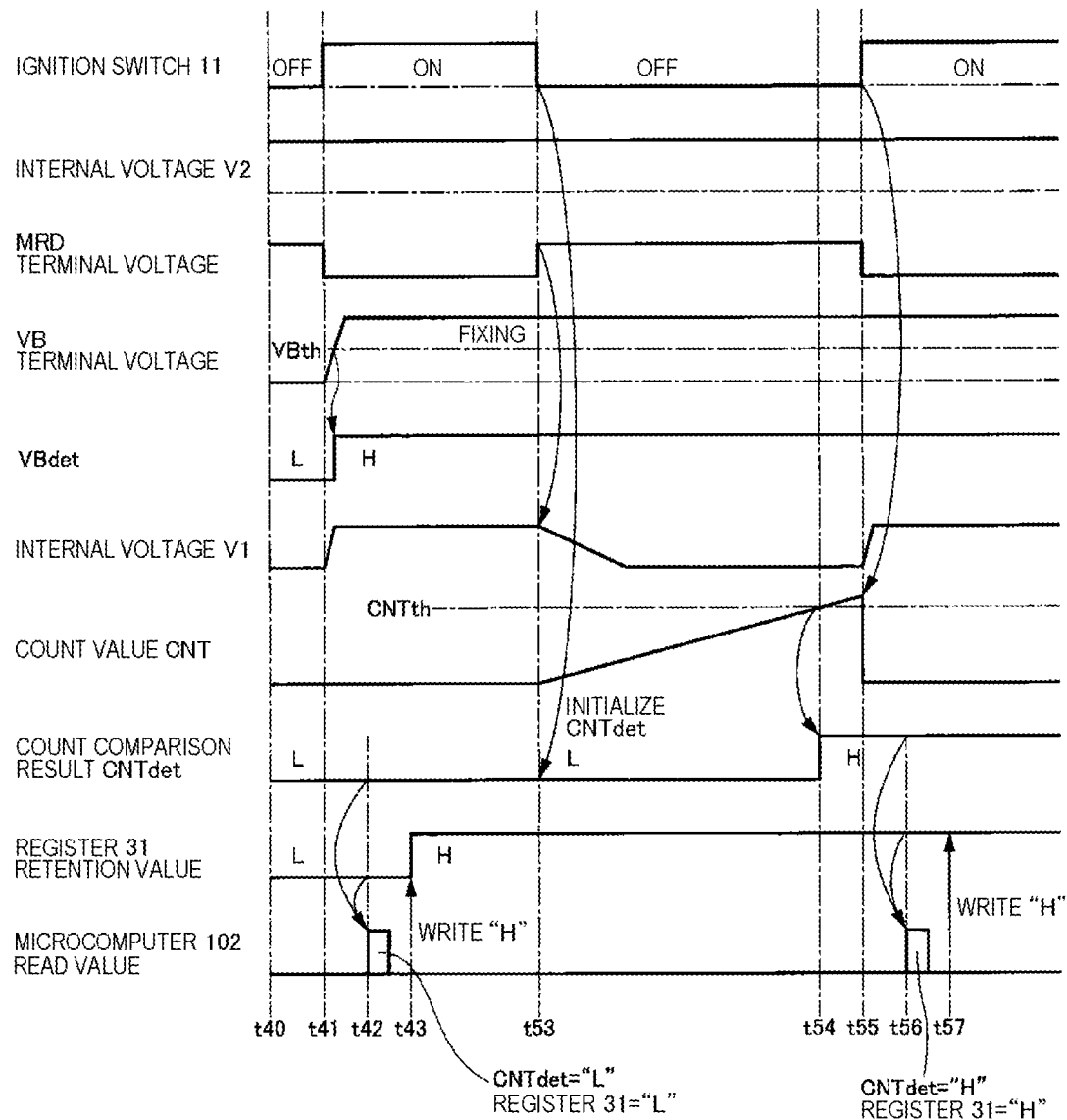
FIG. 15 is a timing chart illustrating an example of an operation when the power supply relay is fixed on in the electronic control device of the third embodiment of the present invention.

FIG. 15 is a timing chart illustrating an example of the operation when the power supply relay 12 is fixed on in the electronic control device 100B. In the timing chart of FIG. 15, the on or off of the power supply relay 12 can be controlled from the initial time t40 to the time t43 similarly to FIG. 13, but the description will be given assuming that the power supply relay 12 is fixed in the on state during the time from the time t43 to a time t53. Because the operation from the initial time t40 to the time t43 is the same as the example in FIG. 13, the description thereof will be omitted.

In the case where the ignition switch 11 is switched from on to off at the time t53 after the power supply relay 12 is fixed in the on state from the time t43 to the time t53, the operation of the electronic control device 100B is the same as the operation at the time t10 described in the first embodiment (FIG. 6) because the power supply relay 12 is fixed in the on state. The operation at the time t53 of the third embodiment is different from the operation at the time t10 in FIG. 6 in that the timer circuit 32 starts the measurement of the off-time of the ignition switch 11 to initialize the count comparison result CNTdet to the L level. Similarly to the description at the time t44 in FIG. 13, in the third embodiment, because the initial state of the count comparison result CNTdet is described as the L level, the value of the count comparison result CNTdet does not change before and after the writing is performed at the time t43.

At a time t54, when the count value CNT of the counter 321 of the timer circuit 32 reaches the count threshold CNTth, the count comparison result CNTdet of the count comparison circuit 322 changes to the H level.

Then, when the ignition switch 11 is turned on again at a time t55, the power supply voltage VBAT is applied to the first power supply circuit 21 through the terminal PSA. The first power supply circuit 21 outputs the internal voltage V1, and the communication circuit 40 and the microcomputer 102 start the operation.

At a time t56, the microcomputer 102 reads the data held in the register 31 through the communication circuit 40 and the count comparison result CNTdet output from the timer circuit 32. At the time t54, the data held in the register 31 and the count comparison result CNTdet are at the H level, and the microcomputer 102 reads the data at the H level as the data held in the register 31 and the count comparison result CNTdet. At a time t57, the microcomputer 102 writes the H-level data in the register 31 similarly to the time t43.

At this point, regarding the operation of the electronic control device 100B, a difference between the timing charts in FIGS. 14 and 15 will be considered. FIG. 15 is different from FIG. 14 in that the count value CNT of the timer circuit 32 exceeds the count threshold CNTth and the count comparison result CNTdet is at the H level in the off-period of the ignition switch 11.

About the count threshold CNTth, a desired value can be written from the microcomputer 102 through the communication circuit 40. As illustrated in FIG. 13, after the voltage at the terminal VB after the turn-off of the ignition switch 11 falls below the threshold voltage VBth of the voltage detection circuit 30, the count output CNT of the timer circuit 32 is appropriately set to exceed the count threshold CNTth. Thus, the third embodiment can be used as measures for preventing the erroneous diagnosis of the on-fixing of the power supply relay 12.

That is, the microcomputer 102 can determine that the power supply relay 12 is on-fixed only when all the read data are at the H level in the case where the microcomputer 102 reads the held data of the register 31 and the count comparison result CNTdet through the communication circuit 40 after the turn-on of the ignition switch 11 in the state in which the count threshold CNTth is appropriately set.

From the above description, the configuration and operation of the electronic control device 100B that detects that the power supply relay 12 is fixed on and that prevents the erroneous detection that the power supply relay 12 is fixed even when the ignition switch 11 is turned on again before the voltage at the terminal VB falls below the threshold voltage VBth because the ignition-off period is short even though the power supply relay 12 is not actually fixed on.

As described above, in the electronic control device (electronic control device 100B) of the third embodiment, the processor (processor 102a) further includes the timer circuit (timer circuit 32) that measures the time during which the power supply (ignition switch 11) is off. When the measurement time (count value CNT) of the timer circuit is less than or equal to the threshold (count threshold CNTth) set based on the time required for the fall of the first power supply voltage (the power supply voltage VBAT through the terminal VB) below the threshold voltage (VBth) since the turn-off of the power supply, the processor (processor 102a) performs the control not to detect the fixing abnormality of the power supply relay (power supply relay 12).

According to the electronic control device having the above configuration, when the time (measurement time) during which the power supply is turned off is less than or equal to the threshold set based on the time required for the fall of the first power supply voltage below the threshold voltage since the turn-off of the power supply, the fixing abnormality of the power supply relay is not detected. As described above, when the first power supply voltage does not decrease to the threshold voltage due to the short power-off time, the fixing abnormality detection is not performed, so that the erroneous detection of the fixing abnormality of the power supply relay can be prevented.

In the electronic control device (electronic control device 100B) of the third embodiment, the processor (processor 102a) detects the fixing abnormality of the power supply relay (power supply relay 12) based on the information read from the storage (register 31) when the measurement time of the timer circuit (timer circuit 32) exceeds the threshold (count threshold CNTth) set based on the time required for the fall of the first power supply voltage (the power supply voltage VBAT through the terminal VB) below the threshold voltage (VBth) after the turn-off of the power supply (ignition switch 11).

According to the electronic control device having the above configuration, the erroneous detection of the fixing abnormality of the power supply relay can be prevented by detecting the fixing abnormality of the power supply relay based on the information read from the storage after the check of the certain decrease in the first power supply voltage to the threshold voltage.

Modification of Third Embodiment

In the third embodiment, the count value CNT corresponding to the off-period of the ignition switch 11 is initialized by turning on the ignition switch 11. An example in which the count value CNT is initialized by another method will be described as a modification of the third embodiment.

Figure 16:
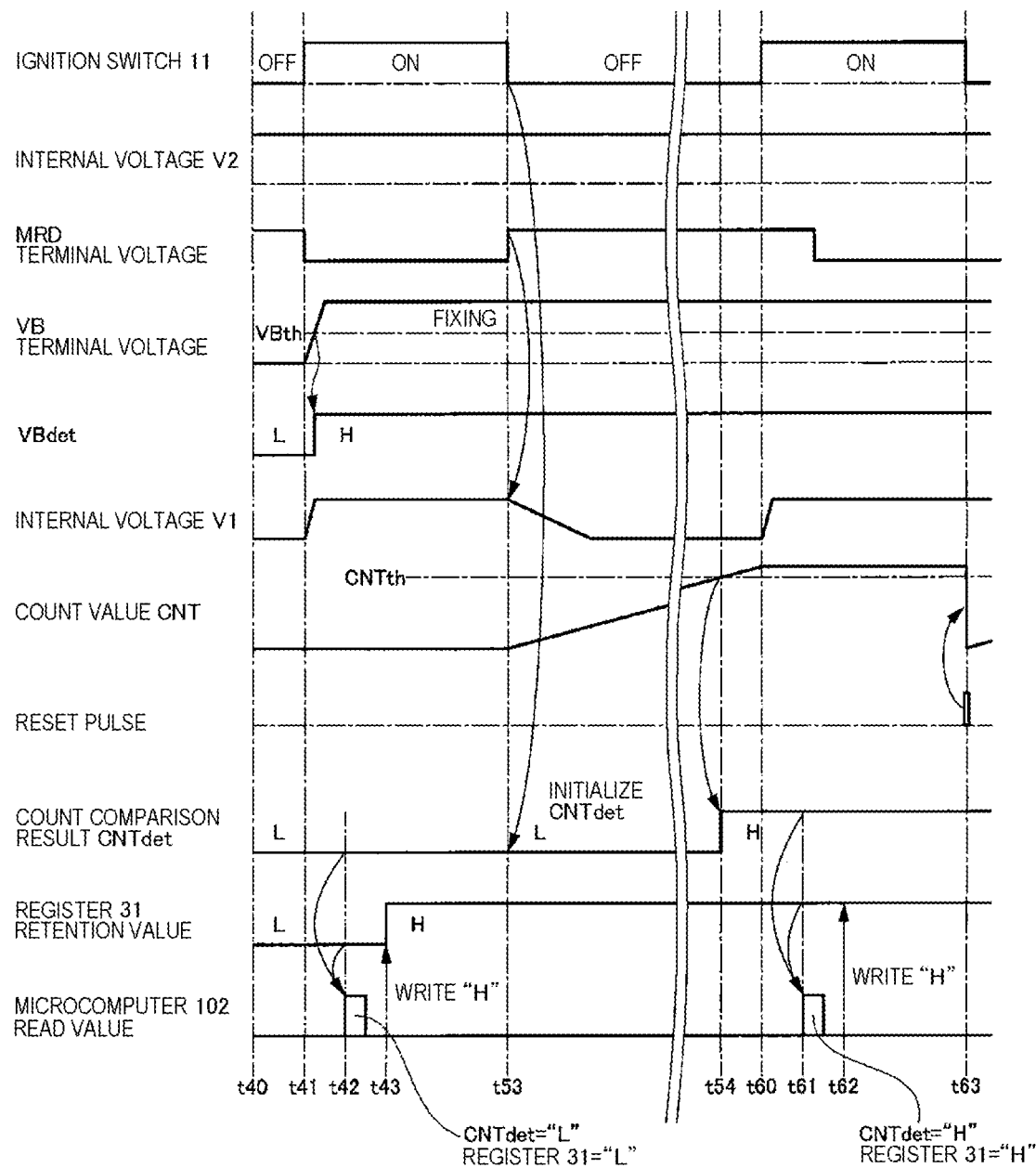
FIG. 16 is a timing chart illustrating another example of the operation when the power supply relay is fixed on in the electronic control device according to a modification of the third embodiment of the present invention.

FIG. 16 is a timing chart illustrating another example of the operation when the power supply relay is fixed on in the electronic control device according to the modification of the third embodiment. In the timing chart of FIG. 16, the operations from the initial time t40 to the time t43 and from the time t53 to the time t54 are the same as those in the example of FIG. 13, so that the description thereof is omitted.

When the ignition switch 11 is turned on again at a time t60, the power supply voltage VBAT is applied to the first power supply circuit 21 through the terminal PSA. The first power supply circuit 21 outputs the internal voltage V1, and the communication circuit 40 and the microcomputer 102 start the operation.

In the examples of FIGS. 13 to 15, the count value CNT of the timer circuit 32 is returned to zero by turning on the ignition switch 11, but in the example of FIG. 16, the count value CNT is not reset. When the ignition switch 11 is turned on, the count value CNT of the counter 321 at that time is held.

At a time t61, the microcomputer 102 reads the data held in the register 31 through the communication circuit 40. The microcomputer 102 determines the presence or absence of the fixing of the power supply relay 12 based on the read data of the register 31 and the count comparison result CNTdet. At a time t62, the microcomputer 102 writes the H-level data in the register 31 similarly to the time t43.

Then, when the ignition switch 11 is switched off again at a time t63, another circuit in the second power supply system block 120B or the microcomputer 102 outputs a reset pulse to the timer circuit 32. The timer circuit 32 receives the reset pulse, returns the count value CNT to zero, and then increases the count value CNT according to the off-period of the ignition switch 11.

4. Others

The present invention is not limited to the first to third embodiments, but various other application examples and modifications can be taken without departing from the gist of the present invention described in the claims.

For example, the first to third embodiments describe the configuration of the electronic control device in detail and specifically in order to help understand the present invention, and are not necessarily limited to those including all the components described above. Furthermore, another configuration can be added to, deleted from, and replaced with other configurations for a part of the configuration of each embodiment.

For example, in the third embodiment, in order to determine the off-period of the ignition switch, the microcomputer 102 can write the count threshold CNTth through the communication circuit 40, and only the count comparison result CNTdet is read from the timer circuit 32. However, the microcomputer 102 may be configured to read the count value CNT that is the output of the counter 321 of the timer circuit 32 through the communication circuit 40, and compare the read count value CNT with the threshold set in the microcomputer 102 to determine the off-period.

In the first to third embodiments, as an example of the configuration of the voltage detection circuit 30, the VB wiring is connected to the non-inverting input terminal of the comparator 301, and the threshold voltage VBth is input to the inverting input terminal to compare the voltages. However, the configuration may be implemented by another circuit as long as the same effect can be obtained.

In addition, all the components described in the electronic control device 100 may be integrated circuits formed on the same semiconductor chip, or each component may be divided into a plurality of components.

For example, the first power supply circuit 21, the second power supply circuit 22, the relay drive circuit 13, the communication circuit 40, and the like described as the components of the power supply ICs 101,101B may be mounted on the electronic control device 100 as separate components.

Some or all of the configurations, functions, processing units, and the like may be designed with, for example, an integrated circuit, and implemented by hardware. A field programmable gate array (FPGA), an application specific integrated circuit (ASIC), or the like may be used as the hardware. In addition, each of the above-described components, functions, and the like may be implemented by software. When the processing is performed by software, for example, the processing may be performed by the processor 102a such as a CPU provided in the electronic control device reading and sequentially executing a computer program stored in a recording medium (memory 102b) such as a ROM provided inside the electronic control device.

The control lines and information lines illustrated in the above-described embodiments indicate those which are considered necessary for the description, but do not necessarily indicate all the control lines and information lines necessary for the product. Actually, it can be considered that almost all the constituents are connected to each other.

REFERENCE SIGNS LIST 10 battery
11 ignition switch
12 power source relay
12a coil
12b contact
13 relay drive circuit
131 switching element
21 first power supply circuit
22 second power supply circuit
30 voltage detection circuit
301 comparator
31 register
311 D-type flip-flop
32 timer circuit
321 counter
322 count comparison circuit
322a comparator
322b register
40 communication circuit
100, 100A, 100B electronic control device
101, 101B power supply IC
102 microcomputer 110 first power supply system block
120, 120B second power supply system block
CNT count value
CNTdet count comparison result
CNTth count threshold
V1 first internal voltage
V2 second internal voltage
VBdet voltage detection result
VBth threshold voltage

The invention claimed is:

1. An electronic control device comprising:
a relay drive circuit that controls on and off of a power supply relay according to information about on and off of a power supply;
an electronic circuit that operates at a first power supply voltage supplied from a battery through the power supply relay; and
a monitoring unit that monitors the first power supply voltage when the power supply is turned off, and holds a monitoring result, the first power supply voltage reflecting presence or absence of fixing of the power supply relay, wherein
the monitoring unit includes:
a voltage detection circuit that outputs a signal of a level corresponding to a voltage value of the first power supply voltage, and
a storage that holds information indicating the presence or absence of a decrease in the first power supply voltage based on the signal output from the voltage detection circuit when the power supply is off as the monitoring result, wherein
the electronic circuit includes a processor that reads information indicating the presence or absence of the decrease in the first power supply voltage held in the storage and writes the information in the storage,
the processor detects fixing abnormality of the power supply relay based on the information read from the storage, and
the voltage detection circuit compares the first power supply voltage with a threshold voltage, outputs a high-level signal to the storage when the first power supply voltage is greater than the threshold voltage, and outputs a low-level signal otherwise.

2. The electronic control device according to claim 1, wherein the processor performs reading on the storage when the power supply is switched from off to on, and detects the fixing abnormality of the power supply relay based on first read information previously read from the storage and second read information currently read from the storage.

3. The electronic control device according to claim 2, wherein the processor determines that the power supply relay is the fixing abnormality when the first read information previously read from the storage is information indicating a low level and the second read information currently read from the storage is information indicating a high level.

4. The electronic control device according to claim 3, wherein the processor reads information from the storage when the power supply is turned on from off, and writes information indicating the high level in the storage after reading the information from the storage.

5. The electronic control device according to claim 1, wherein the storage holds and outputs information written by the processor, resets the held information by a signal obtained by inverting the low-level signal output from the voltage detection circuit, and outputs the low-level signal.

6. The electronic control device according to claim 1, wherein the monitoring unit operates with a second power supply voltage supplied from the battery by a path not through the power supply relay.

7. The electronic control device according to claim 1, wherein the monitoring unit operates by the first power supply voltage.

8. The electronic control device according to claim 6, wherein
the monitoring unit further includes a timer circuit that measures time after the turn-off of the power, and
the processor performs control not to detect the fixing abnormality of the power supply relay when a measurement time of the timer circuit is less than or equal to a threshold set based on time required for fall of the first power source voltage below the threshold voltage after turn-off of the power source.

9. The electronic control device according to claim 8, wherein the processor detects the fixing abnormality of the power source relay based on the information read from the storage when the measurement time of the timer circuit exceeds the threshold set based on the time required for the fall of the first power source voltage below the threshold voltage after the turn-off of the power source.

* * * * *